US006184110B1

United States Patent
Ono et al.

(10) Patent No.: US 6,184,110 B1
(45) Date of Patent: *Feb. 6, 2001

(54) METHOD OF FORMING NITROGEN IMPLANTED ULTRATHIN GATE OXIDE FOR DUAL GATE CMOS DEVICES

(75) Inventors: Yoshi Ono, Camas; Yanjun Ma, Vancouver, both of WA (US)

(73) Assignees: Sharp Laboratories of America, Inc., Camas, WA (US); Sharp Kabushiki Kaisha, Osaka (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/071,234

(22) Filed: Apr. 30, 1998

(51) Int. Cl.⁷ .................................................. H01L 21/26
(52) U.S. Cl. ...................... 438/513; 438/513; 438/591; 438/787; 257/69
(58) Field of Search ................... 438/513, 787, 438/591; 257/69

(56) References Cited

U.S. PATENT DOCUMENTS

| | | | |
|---|---|---|---|
| 5,629,221 | * 5/1997 | Chao et al. | 438/591 |
| 5,672,541 | * 9/1997 | Booske et al. | 437/160 |
| 5,683,918 | * 11/1997 | Smith et al. | 437/21 |
| 5,953,600 | * 9/1999 | Gris | 438/200 |

OTHER PUBLICATIONS

Article entitled "Surface Nitridation of Silicon Dioxide with a High Density Nitrogen Plasma", by R. Kraft, T.P. Schneider, W.W. Dostalik and S. Hattangady published in 1997 American Vacuum Society Technol. B 15(4), Jul./Aug. 1997, pp 967–970.

Article entitled "Separation of Plasma Iimplantation of Oxygen to Form Silicon on Insulator" by X. Lu, S. Lyer, J. Liu, C. Hu and N.A. Cheung, published in 1997 American Institute of Physics Letter 70(13), Mar. 31, 1997, pp. 1748–1750.

Article entitled "The Effects of Nitrogen Implant into Gate Electrode on the Characteristics of Dual–Gate MOSFETs with Ultra–thin Oxide and Oxynitrides" by A.I. Chou, C. Lin, K. Kumar, P. Chowhry, M. Gardner, M. Gilmer, J. Fulford and J.C. Lee published in 1997 IEEE, Sep. 1997, pp. 174–177.

* cited by examiner

*Primary Examiner*—Matthew Smith
*Assistant Examiner*—Granvill Lee, Jr.
(74) *Attorney, Agent, or Firm*—David C. Ripma; Matthew D. Rabdau; Scott C. Krieger

(57) ABSTRACT

A method of forming a nitrogen-implanted gate oxide in a semiconductor device includes preparing a silicon substrate; forming an oxide layer on the prepared substrate; and implanting $N^+$ or $N_2^+$ ions into the oxide layer in a plasma immersion ion implantation apparatus.

21 Claims, 3 Drawing Sheets

METHOD OF FORMING NITROGEN IMPLANTED ULTRATHIN GATE OXIDE FOR DUAL GATE CMOS DEVICES

FIELD OF THE INVENTION

This invention relates to the fabrication of MOSFET devices that require an extremely reliable gate oxide process for control of the transistor, and specifically for deep submicron devices that require boron-doped gate polysilicon for the pMOS part of the CMOS flow.

BACKGROUND OF THE INVENTION

Gate oxides that are incorporated into 0.25 μm CMOS processes are extremely thin, on the order of 3.5 to 4.0 nm thick. Such oxides need to be a highly reliable insulator. Techniques to grow these thin oxide layers involve the use of one or more of the following gases: $O_2$ (oxygen), $H_2O$ (water vapor), $N_2O$ (nitrous oxide), and NO (nitric oxide).

In known prior art, the gate polysilicon is doped with phosphorous to form the $N^+$ gate for both nMOS and pMOS devices. For smaller channel lengths, i.e., 0.25 μm and below, it is necessary to form $p^+$ doped polysilicon gates using boron for the pMOS devices to minimize short channel effects. The diffusion of boron through the gate oxide and into the channel region results in the shifting of threshold voltages and unpredictability in the performance of the ultimate circuit after fabrication, particularly as the device ages. Therefore, in devices where boron is present in the gate polysilicon it becomes necessary for the gate oxide to act as a barrier to the diffusion of boron atoms.

SUMMARY OF THE INVENTION

A method of forming a nitrogen-implanted gate oxide in a semiconductor device includes preparing a silicon substrate; forming an oxide layer on the prepared substrate; and implanting $N^+$ ions into the oxide layer in a plasma immersion ion implantation apparatus.

An object of the invention is to place nitrogen at the top surface of an oxide layer prior to deposition of the gate polysilicon.

Another object of the invention is to provide nitrogen implantation into an oxide layer to effectively block the diffusion of boron into the oxide layer.

A further object of the invention is to preserve the reliability of a device constructed according to the invention, while maintaining the desired properties of the polysilicon layer.

DETAILED DESCRIPTION OF THE PREFERRED EMBODIMENT

One technique for growing an oxide with boron barrier properties is to use the nitrogen containing oxidants $N_2O$ or NO during the oxidation. The resulting oxide is better than a conventional pure $O_2$ oxide or pyrogenic $H_2O$ oxide, because it places nitrogen at the oxide-to-substrate silicon interface, which is known to block the boron from moving into the transistor channel region.

Figure 1:
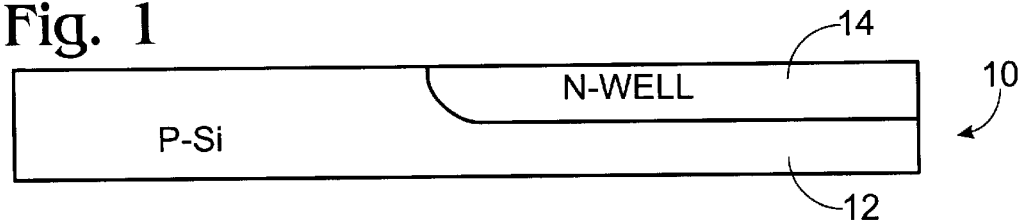
FIGS. 1–4 depict successive stages in the formation of a CMOS gate oxide according to the invention.
Figure 2:
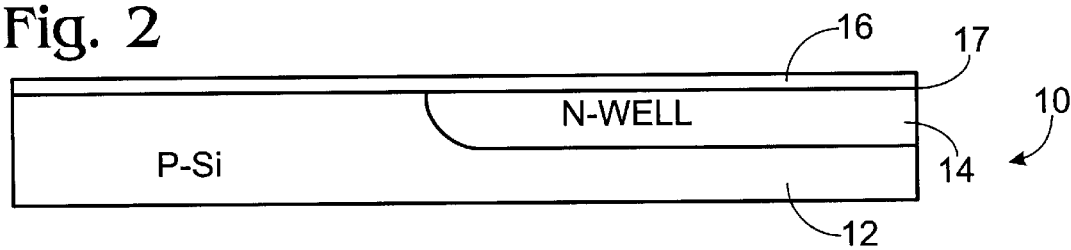

Referring now to FIG. 1, standard integrated circuit processing steps are implemented on a silicon wafer 10 to form a pSi substrate 12. An well 14 is formed in pSi substrate 12 by conventional means. Turning now to FIG. 2, a thin gate oxide layer 16, having a thickness of between 1.0 nm and 10 nm is grown on wafer 10. Any standard material and technique may be used to form this gate dielectric layer.

Figure 3:
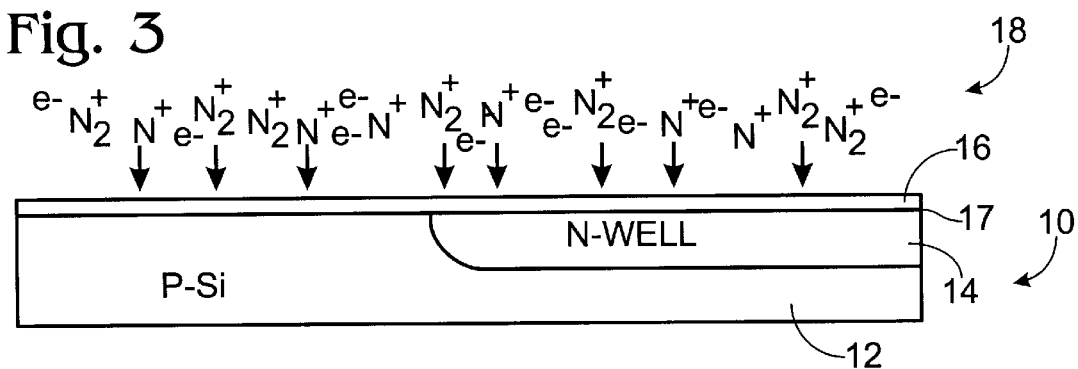

For the step depicted in FIG. 3, wafer 10 is placed in a plasma immersion ion implantation (PIII) process chamber 22, where a pure $N_2$ plasma 18 is struck, and a mild pulse is applied to the wafer which causes nitrogen to be implanted into the gate dielectric near the top surface of oxide layer 16, and away from an $SiO_2$/Si interface 17. $N^+$ and $N_2^+$ ions are implanted into oxide layer 16 at an energy of between 0.1 keV and 2.0 keV, at a dose of between $1·10^{13}$ $cm^{-2}$ and $1·10^{16}$ $cm^{-2}$, in the preferred embodiment. Implantation time varies between 10 seconds and 3 minutes.

Figure 4:
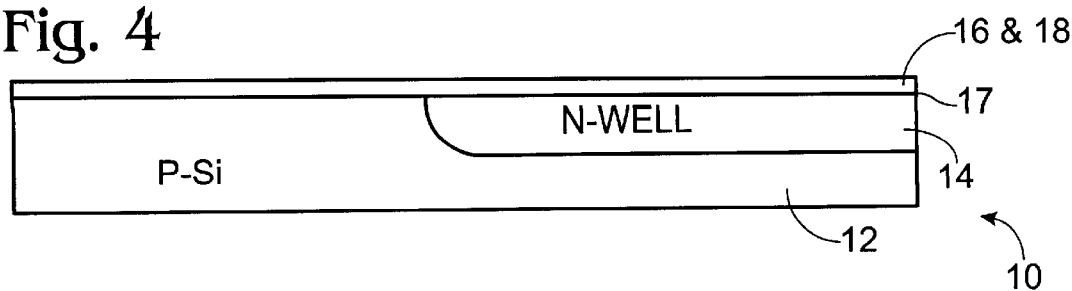

An anneal at a higher temperature follows, FIG. 4, which assists in the formation of stronger bonds within the gate insulator, and heals some of the damage created during the implant, creating an oxide layer having the desired concentration of nitrogen therein, 16+18. The annealing step is performed at a temperature of between 600° C. and 1050° C. for a period of 10 seconds to one hour. The gate polysilicon is deposited and is followed by the standard doping, annealing, and patterning steps required to complete the fabrication of the integrated circuit.

Figure 5A:
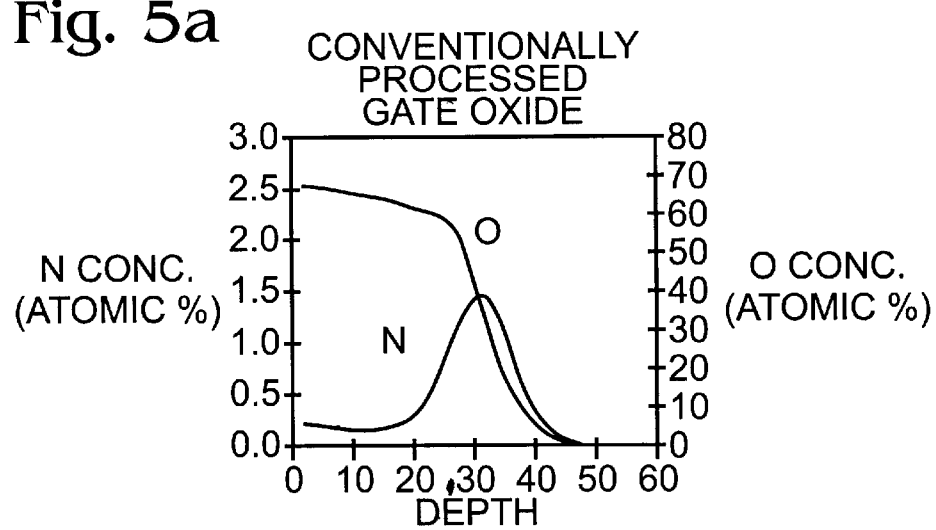
FIG. 5 depicts secondary ion mass spectrometry (SIMS) nitrogen concentration profiles as a function of depth in a conventionally processed device, FIG. 5a, by rapid thermal oxidation or furnace, compared to the desired profile, FIG. 5b.

A schematic of the secondary ion mass spectrometry (SIMS) analysis, which probes the atomic nitrogen and oxygen concentrations with depth into the sample, is shown in FIG. 5. Line "O" depicts the atomic percentage of oxygen vs. depth of oxide layer 16. Line "N") depicts the atomic percentage of nitrogen vs. depth of oxide layer 16. The conventional technique, the results of which are depicted in FIG. 5a, allows the nitrogen to exists at the bottom of the oxide layer, letting boron permeate the oxide itself, thereby reducing the reliability of the insulator. The nitrogen at the oxide-substrate interface also adversely affects the transistor drive current and device speed. The effective mobility, p, of carriers is decreased with more nitrogen at $SiO_2$/Si interface 17, as shown in the FIG. 6, in the case of NMOS transistors.

Figure 5B:
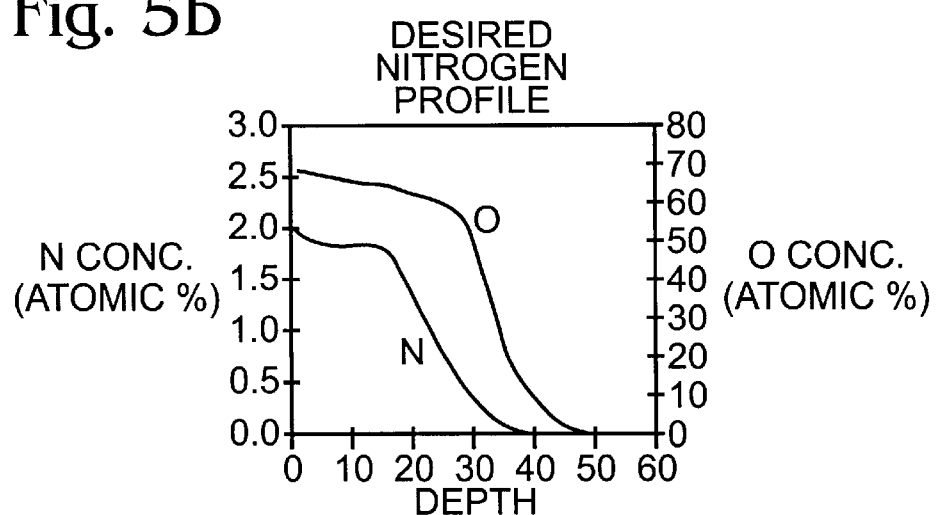
Figure 6:
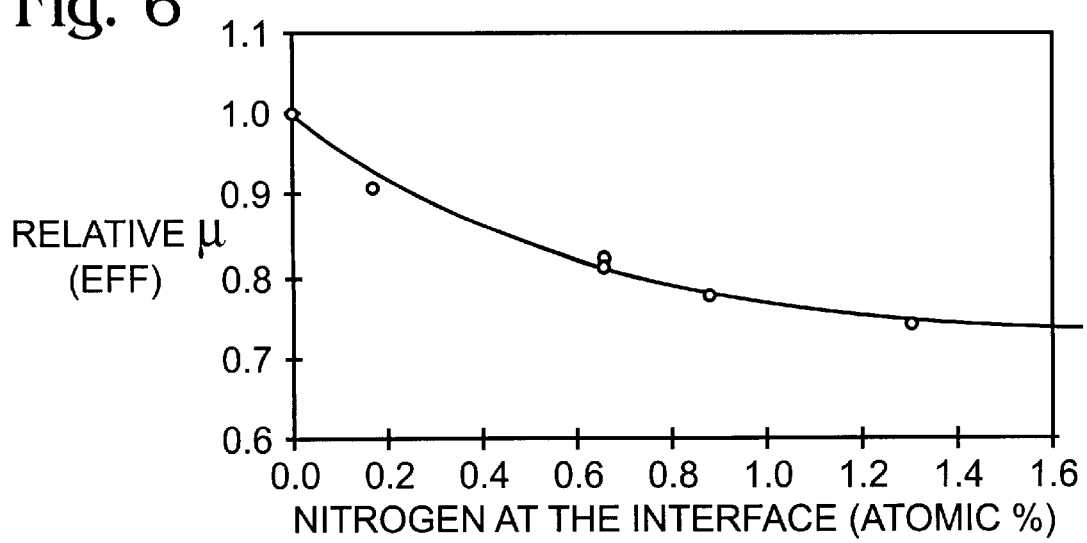
FIG. 6 depicts the effect of nitrogen concentration at the $SiO_2$/Si interface on nMOS transistor carrier mobility.

A concentration profile for oxygen and nitrogen at interface 17 is depicted in FIG. 5b, which depicts secondary ion mass spectrometry (SIMS) nitrogen concentration profiles, N, as a function of depth in a desired device. A method is needed to place nitrogen near the oxideto-polysilicon gate interface to inhibit diffusion of boron into the oxide without impacting carrier mobility.

Implantation of nitrogen, using conventional implantation techniques, into the gate polysilicon has been shown to improve the boron diffusion properties. Nitrogen that is placed within the polysilicon film itself will also inhibit boron diffusion. The problems with this technique, however, is that control of the implant energy is critical. Implantation at too high an energy may cause damage to the oxide, thereby reducing its reliability. Implantation at too low an energy will leave nitrogen in the polysilicon, which may increase its resistivity and lead to poly depletion effects.

As previously stated, an object of the invention is to place nitrogen at the top surface of the oxide prior to deposition of the gate polysilicon. This will effectively block the diffusion of boron into the insulator layer and preserve its reliability, while maintaining the desired properties of the polysilicon layer.

Figure 7:
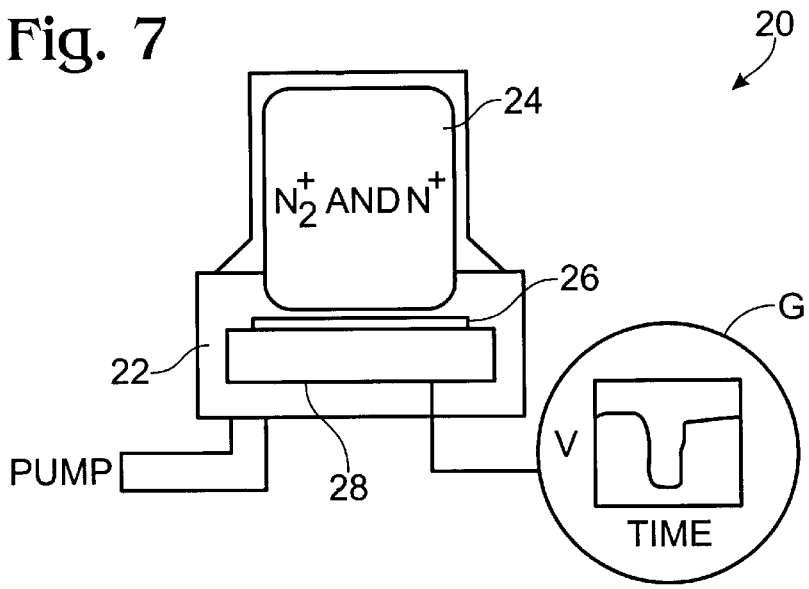
FIG. 7 is a schematic diagram of a plasma immersion ion implantation apparatus.

The method of the invention results in the placement of nitrogen at the top surface of oxide layer 16 by plasma immersion ion implantation (PIII). Referring now to FIG. 7, a PIII apparatus is depicted generally at 20. PIII apparatus 20 includes a vacuum chamber 22. A plasma discharge 24, containing the material that is desired to be implanted, in this case $N_2^+$ and $N^+$ ions, is created in vacuum chamber 22. A wafer 26 is placed on a chuck 28 that is biased with negative voltage pulses of very short duration and high amplitudes of less than 3kV but at a high repetition rate, as shown in the inset graph, G. The negative pulse on chuck 28 attracts positive charged species towards the substrate of wafer 26. By adjusting the power of the plasma discharge and the voltage amplitude, pulse width, and repetition rate, the ionized species is embedded into gate oxide layer 16 either towards the lower interface, the bulk oxide, or the top surface. The variables are adjusted, in practicing the method of the invention, to embed nitrogen ion near the upper surface of oxide layer 16.

Figure 8:
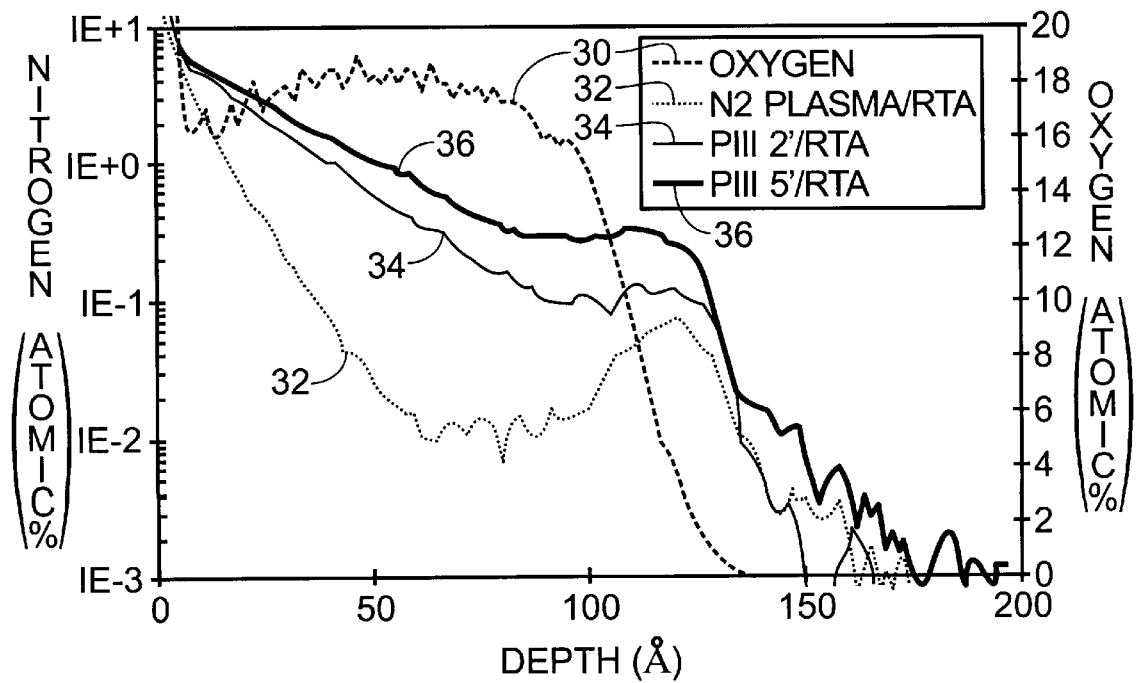
FIG. 8 depicts the resulting SIMS profile of oxygen and nitrogen in $N_2$ plasma implantation into a 120 Å gate oxide.

Experiments, using a variety of techniques, and varying parameters, were performed to investigate the viability of the method of the invention, and resulted in the nitrogen profiles shown in FIG. 8. FIG. 8 depicts the resulting SIMS profile of oxygen and nitrogen in $N_2$ plasma implantation into a 120 Å gate oxide. The oxygen concentration of conventional techniques is depicted by trace 30. Exposure to the $N_2$ plasma only, trace 32, with no implanting pulses, incorporates a small amount of nitrogen into the film and interface, which is well above the detection limit. The implantation pulses turned on for two minutes, trace 34, resulted in an order of magnitude more nitrogen in the bulk of the oxide for an oxide layer thickness of 10 nm. Even though there is some nitrogen at the interface, it is approximately 0.1 atomic percent which will result in only a 5% degradation in carrier mobility, from FIG. 5. A longer implantation time (5minutes), trace 36, results in even more nitrogen in the bulk and interface which illustrates the dose control possible with implant time, for an oxide layer thickness of 1.0 nm to 10 nm. Optimization of the implant conditions needs to be performed for each gate oxide thickness using the parameters set forth herein.

Thus, a method of fabricating MOSFET devices which require a reliable gate oxide process for control of the transistor, and specifically for deep submicron devices that require boron-doped gate polysilicon for the pMOS part of the CMOS flow for threshold voltage control and insensitivity to device size has been disclosed. Although a preferred embodiment of the invention has been disclosed, it will be appreciated that further modifications and variations may be made thereto without departing from the scope of the invention as defined in the appended claims.

We claim:

1. A method of forming a nitrogenimplanted gate oxide in a semiconductor device, comprising:
   preparing a silicon substrate;
   forming an oxide layer having a thickness of between 1.0 nm and 10 nm on the prepared substrate; and
   implanting $N^+$ ions into the oxide layer in a plasma immersion ion implantation apparatus, wherein said implanting includes electrically biasing the prepared substrate and implanting $N^+$ ions at an energy of between 0.1 keV and 2.0 keV, at a dose of between $1 \cdot 10^{13}$ cm$^{-2}$ and $1 \cdot 10^{16}$ cm$^{-2}$.

2. The method of claim 1 which includes, after said implanting, annealing the implanted substrate at a temperature of between 600° C. and 1050° C. for a period of 10 seconds to one hour.

3. A method of forming a nitrogen-implanted gate oxide in a semiconductor device, comprising:
   preparing a silicon substrate;
   forming an oxide layer having a thickness of between 1.0 nm and 10 nm on the prepared substrate; and
   forming a barrier layer at the upper surface of the oxide layer by electrically biasing the silicon substrate and implanting ions, whereby said barrier layer blocks diffusion of boron from subsequently formed layers.

4. The method of claim 3 wherein said forming a barrier layer includes implanting $N^+$ ions into the oxide layer at an energy of between 0.1 keV and 2.0 keV, at a dose of between $1 \cdot 10^{13}$ CM$^{-2}$ and $1 \cdot 10^{16}$ cm$^{-2}$.

5. The method of claim 4 wherein said implanting is done in a plasma immersion ion implantation apparatus.

6. The method of claim 4 which includes, after said implanting, annealing the implanted substrate at a temperature of between 600° C. and 1050° C. for a period of 10 seconds to one hour.

7. The method of claim, 3, wherein said silicon substrate is negatively biased, whereby positive ions are attracted to the silicon substrate.

8. The method of claim 7, wherein said silicon substrate is negatively biased using a pulse.

9. The method of claim 8, wherein said pulse is repeated at a predetermined repetition rate.

10. The method of claim 8, wherein said pulse is less than 3 kV.

11. The method of claim 7, wherein said ions comprise $N^+$ and $N_2^+$ ions.

12. The method of claims 3, wherein said implanting ions continues for approximately between ten seconds and three minutes.

13. A method of forming a nitrogen-implanted gate oxide in a semiconductor device, comprising:
   preparing a silicon substrate;
   forming an oxide layer having a thickness of between 1.0 nm and 10 nm on the prepared substrate;
   placing the prepared substrate within a vacuum chamber on a chuck that is biased with voltage pulses; and
   creating a plasma discharge within the vacuum chamber, wherein said plasma discharge includes material to be implanted, whereby the material is attracted to the prepared substrate on the biased chuck and implanted into the oxide layer.

14. The method of claim 13, wherein the plasma discharge can be adjusted.

15. The method of claim 13, wherein the voltage pulses have an adjustable voltage that affects the depth of penetration of the ions.

16. The method of claim 15, wherein the voltage pulses have a voltage of less than approximately 3 kV.

17. The method of claim 13, wherein the voltage pulses have an adjustable pulse width that affects the depth of penetration of the ions.

18. The method of claim 13, wherein the voltage pulses have an adjustable repetition rate that affects the depth of penetration of the ions.

19. A method of providing a gate oxide in a semiconductor device comprising the following steps:
   preparing a silicon substrate for the formation of a device having a channel region and a polysilicon gate which, when completed, includes boron in the gate polysilicon;

forming an oxide layer having a thickness of between 1.0 nm and 10 nm on the prepared substrate, said oxide layer to become the gate oxide for said device when said device is completed;

implanting $N^+$ ions into the oxide layer in a plasma immersion ion implantation apparatus, said implanting includes implanting $N^+$ ions at an energy of between 0.1 keV and 2.0 keV, such that nitrogen is embedded in said oxide layer to block the diffusion of boron from the gate into the channel region of the device.

20. A method as in claim 19 in which said implanting step further includes electrically biasing the prepared substrate during implantation.

21. A method as in claim 19 including the step, after said implanting step, of annealing the implanted substrate at a temperature of between 600° C. and 1050° C. for a period of 10 seconds to one hour.

* * * * *